//
US006887781B2

United States Patent
Lee et al.

(10) Patent No.: US 6,887,781 B2
(45) Date of Patent: May 3, 2005

(54) METHOD FOR THE FORMATION OF DIFFUSION BARRIER

(75) Inventors: Sang-Hyeob Lee, Santa Clara, CA (US); Sasangan Ramanathan, San Ramon, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/425,306

(22) Filed: Apr. 29, 2003

(65) Prior Publication Data

US 2003/0194858 A1 Oct. 16, 2003

Related U.S. Application Data

(62) Division of application No. 09/749,706, filed on Dec. 27, 2000, now abandoned.

(51) Int. Cl.[7] ...................... H01L 21/44; H01L 21/4763
(52) U.S. Cl. ...................... 438/627; 438/628; 438/643; 438/644; 438/653; 438/654; 438/687
(58) Field of Search .............................. 438/627–630, 438/642–644, 687, 653, 654

(56) References Cited

U.S. PATENT DOCUMENTS

| 4,751,101 | A | | 6/1988 | Joshi | |
|---|---|---|---|---|---|
| 5,654,245 | A | * | 8/1997 | Allen | 438/629 |
| 5,700,726 | A | | 12/1997 | Huang et al. | |
| 6,069,068 | A | | 5/2000 | Rathore et al. | |
| 6,156,655 | A | * | 12/2000 | Huang et al. | 438/687 |
| 6,214,731 | B1 | * | 4/2001 | Nogami et al. | 438/687 |
| 6,225,221 | B1 | * | 5/2001 | Ho et al. | 438/678 |
| 6,265,303 | B1 | | 7/2001 | Lu et al. | |
| 6,274,497 | B1 | * | 8/2001 | Lou | 438/687 |
| 6,303,480 | B1 | * | 10/2001 | Desai et al. | 438/584 |
| 6,429,120 | B1 | | 8/2002 | Ahn et al. | |
| 6,461,675 | B2 | * | 10/2002 | Paranjpe et al. | 427/250 |
| 2002/0072227 | A1 | | 6/2002 | Russell et al. | |
| 2002/0197850 | A1 | | 12/2002 | Ahn et al. | |

* cited by examiner

Primary Examiner—Erik Kielin
(74) Attorney, Agent, or Firm—DeLio & Peterson, LLC

(57) ABSTRACT

Electronic components such as semiconductor wafer VLSI and ULSI integrated circuit devices are provided having a robust barrier layer in the device interconnects. The robust barrier layer provides excellent step coverage, low resistance and enhanced adhesion to CVD copper and the interconnect has a double structure of a layer of a barrier material and a metal layer thereon. The metal layer is preferably tungsten and is formed by replacing silicon or other such atoms on the surface of the barrier layer with tungsten metal. A layer of silicon can be formed on the barrier layer, silicon atoms can be formed on the surface by reacting the barrier layer with a silicon containing reactant or a silicon containing barrier layer can be used.

4 Claims, 4 Drawing Sheets

METHOD FOR THE FORMATION OF DIFFUSION BARRIER

This is a divisional of application(s) Ser. No. 09/749,706 filed on Dec. 27, 2000, now abandoned.

BACKGROUND OF THE INVENTION

1. Field of the Invention

This invention relates to the making of electronic components such as semiconductor wafer VLSI and ULSI integrated circuit devices, and, more particularly, to a method for forming a robust barrier layer in the device interconnects with excellent step coverage, uniformity, low resistance and enhanced adhesion to CVD-copper and to the electronic components made by the method.

2. Description of Related Art

The demand for manufacturing semiconductor integrated circuit (IC) devices such as computer chips with high circuit speed, high packing density and low power dissipation requires the downward scaling of feature sizes in ultra-large-scale integration (ULSI) and very-large-scale integration (VLSI) structures. The trend to smaller chip sizes and increased circuit density requires the miniaturization of interconnect features which severely penalizes the overall performance of the structure because of increasing interconnect resistance and reliability concerns such as fabrication of the interconnects and electromigration.

In general, such structures use silicon wafers with silicon dioxide ($SiO_2$) being the dielectric material and openings are formed in the $SiO_2$ dielectric layer in the shape of vias and trenches which are then metallized forming the interconnects. Increased miniaturization is reducing the openings to submicron sizes (e.g., 0.2 micron and lower) and increasing the aspect ratio (ratio of the height of the opening to the width of the opening) of the features.

With the decrease of the design rule, copper gets more focus as a conducting material for the interconnect in ULSI and VLSI devices since it has lower resistivity and higher electromigration resistance than aluminum. Copper easily diffuses through silicon dioxide and silicon, however, and a robust barrier layer to prevent copper diffusion is required to encapsulate the copper interconnect.

Step coverage of the diffusion barrier is also critical for the interconnect. Normally, physical vapor deposition (PVD) does not produce enough material on the side wall of the contact hole or the via, and, as the minimum feature size decreases, this phenomenon gets more critical. On the other hand, chemical vapor deposition (CVD) offers much better step coverage on the side wall of the contact hole and so is the preferable method for the formation of the diffusion barriers. Furthermore, the diffusion barrier itself must be thin and uniform otherwise, the line resistance may be greater than the resistance of aluminum interconnects.

The prior art method for the formation of a diffusion barrier is to deposit a material such as TiN, TiNSi, or Ta, or TaN, or TaSiN by CVD or PVD. CVD copper on these barrier materials has poor adhesion, however, and the copper peels out during a process such as chemical mechanical planarization (CMP) or in the following integration process. PVD Ta and/or PVD TaN, which is the most common barrier in the prior art, is normally followed by PVD copper as a seed for the electro-plating of bulk copper to fill the feature. However, due to poor step coverage on the side wall of the contact or of the trench, it is not easy to fill the three-dimensional structure completely. This phenomenon becomes more serious with the shrinkage of the minimum feature size of the semiconductor device.

Broadly stated, the typical multilayer IC electronic component is built up from a number of layers of a dielectric material layer such as silicon dioxide, fluorinated silicon oxide, polymers including polyimide and fluorinated polyimide, ceramics, carbon and other dielectric materials. In the processing sequence known in the art as the "Damascene Process", the dielectric layer is patterned using known techniques such as the use of a photoresist material which is exposed to define the wiring pattern. After developing, the photoresist acts as a mask through which a pattern of the dielectric material is removed by a subtractive etch process such as plasma etching or reactive ion etching. Using the Damascene Process, openings defining wiring patterns are provided in the dielectric layer, extending from one surface of the dielectric layer to the other surface of the dielectric layer. These wiring patterns are then filled with a metal using a filling technique such as electroplating, electroless plating, chemical vapor deposition, physical vapor deposition or a combination of methods. This process typically includes planarization of the interconnect metal by removing excess metal with a method such as chemical mechanical polishing or planarization. In the Single Damascene Process, vias or openings are provided in the same dielectric layer and filled with metallization to provide electrical contact between layers of wiring levels. In the Dual Damascene Process, the via openings and the wiring pattern openings are both provided in the dielectric layer before filling with metallization. This process simplifies the procedure and eliminates some internal interfaces. These procedures are continued for each layer in the electronic component until the electronic component is completed.

In FIG. 5, a dual Damascene line of the prior art is shown connecting two conductor containing dielectric layers. Dielectric layers 31 and 38 contain metallization 32 in layer 31 and metallization 39 in layer 38. A stud 36 and trench 40 are shown encased by a wall 34 of a diffusion barrier liner. It is this type structure which has been shown to contribute to an interconnected electronic component having a low electromigration life.

The dielectric material provides electrical insulation and electrical isolation between the copper wiring elements. The openings in the dielectric layer typically called vias, when filled with a conductive material, are typically referred to as studs. The studs and a trench for a dual Damascene structure provide the vertical interconnections between the horizontal copper metallization on the various layers of the electronic component.

To avoid metal diffusion between the metal and the dielectric, barrier layers, also referred to as liners, are included in the structure to contain the copper or other metal and to provide improved adhesion of the copper lines and studs to the dielectric or other metallization.

Bearing in mind the problems and deficiencies of the prior art, it is therefore an object of the present invention to provide a multilayer electronic component including components made by using a single Damascene process or a dual Damascene process comprising at least one layer having through openings which are filled with a conductive material to form a trench and/or stud which trench and/or stud electrically connects metallization on other layers and which trench and/or stud has excellent step coverage, uniformity, low resistance and adhesion to CVD-copper.

It is another object of the present invention to provide a method for making a multilayer electronic component having trench and/or stud interconnections including components made using a single Damascene process or a dual Damascene process wherein the trench and/or stud have excellent step coverage, uniformity, low resistance and adhesion to CVD-copper.

A further object of the invention is to provide an interconnect structure in an electronic component for connecting metallization on one layer to metallization on another layer with the interconnect having excellent step coverage, uniformity, low resistance and adhesion to CVD-copper.

Still other objects and advantages of the invention will in part be obvious and will in part be apparent from the specification.

SUMMARY OF THE INVENTION

The above and other objects, which will be apparent to one skilled in the art, are achieved in the present invention which relates in one aspect to an interconnect structure in a multilayer electronic component for connecting metallization layers, the interconnect structure having excellent step coverage, uniformity, low resistance and adhesion to CVD-copper comprising:

a dielectric layer having a through opening to a conductor in another layer;

a diffusion barrier layer in the through opening in the dielectric layer;

a metallic layer on the diffusion barrier layer; and copper or other metal filling the opening to form the interconnect structure.

In a further aspect of the invention a multilayer electronic component is provided such as a VLSI and ULSI integrated circuit device comprising:

a plurality of dielectric layers having metallization therein;

openings in the form of a trench and/or via extending through at least one layer and connecting metallization in another layer;

a diffusion barrier layer in the opening on the dielectric layer;

a metallic layer on the diffusion barrier layer; and copper or other metal filling the opening to electrically connect the metallization in the dielectric layers.

In a further aspect of the invention a method is provided for making multilayer electronic components such as VLSI and ULSI integrated circuit devices wherein interconnects in the devices have excellent step coverage, uniformity, low resistance and adhesion to CVD-copper comprising the steps of:

forming a multilayer electronic component layer by layer with dielectric layers having openings therein with metallization formed in the openings to provide electrical connections between the layers;

forming a diffusion barrier in the opening on the dielectric layer;

forming a metallic layer on the diffusion barrier layer by reacting the barrier layer with a metal containing reactant; and filling the opening with copper or other metal to provide a conductor which contacts the metallization in the dielectric layer to another layer.

In another aspect of the invention the method comprises the steps of:

surface treating the diffusion barrier layer with $SiH_4$ or other gases containing Si to form a Si rich surface, or forming a thin Si deposit on the diffusion barrier layer, preferably an amorphous Si deposit;

exposing the treated surface to a conductive metal containing reactant to replace at least part of the Si with the conductive metal; and forming the metallic conductor in the opening.

In a further aspect of the invention the method comprises the steps of:

forming the diffusion barrier with a material containing silicon, such as titanium silicon nitride;

exposing the diffusion barrier layer to a conductive metal containing reactant to replace at least some of the silicon with the conductive metal; and forming the metallic conductor in the opening.

BRIEF DESCRIPTION OF THE DRAWINGS

The features of the invention believed to be novel and the elements characteristic of the invention are set forth with particularity in the appended claims. The figures are for illustration purposes only and are not drawn to scale, the invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
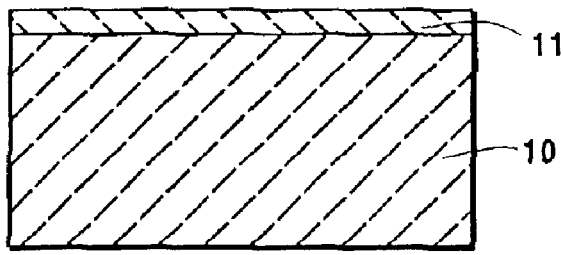
FIGS. 1A–1C show a sequence of steps for forming a metal rich surface on a dielectric according to a method of the invention.

In describing the preferred embodiment of the present invention, reference will be made herein to FIGS. 1A–5 of the drawings in which like numerals refer to like features of the invention. Features of the invention are not necessarily shown to scale in the drawings.

Referring to FIG. 1A, part of a multilayer electronic component is shown schematically and comprises a dielectric layer 10 having a diffusion barrier layer 11 thereon. As will be shown more fully hereinbelow, the dielectric layer 10 is used to form a multilayer electronic component and typically has openings therein in the form of vias and/or lines which are coated with a barrier layer 11. FIG. 1A shows schematically the dielectric layer 10 and the diffusion barrier layer 11 for convenience.

The dielectric layer 10 may be made of any suitable dielectric material depending on the application for the electronic component and includes materials such as silicon dioxide, fluorinated silicon oxide, a polymer such as polyimide, a diamond-like carbon or a spin on glass. The barrier layer 11 may likewise be any suitable material that provides a diffusion barrier between the conductor formed in the dielectric and the dielectric. Preferred diffusion barrier materials are refractory materials such as tantalum, tungsten, tantalum nitride, tungsten nitride, silicon nitride, titanium, titanium nitride, hafnium, hafnium nitride and the like. As will be more fully discussed hereinbelow the diffusion barrier may be a silicon containing refractory material which is used in another aspect of the invention to provide a robust barrier layer.

Figure 1B:
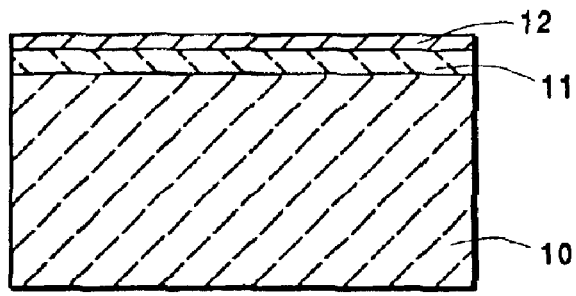

Referring to FIG. 1B, diffusion barrier 11 is surface treated with a metal replacing reactant, preferably a silicon reactant, to form a silicon rich surface 12. Silicon may be also formed as a layer on the diffusion barrier 11. The surface treatment may be made by reacting the diffusion barrier 11 with a reactant such as $SiH_4$ or other gases containing a silicon element or an amorphous silicon deposit may be formed on the surface of diffusion barrier 11 by known methods such as plasma enhanced chemical vapor deposition and/or low pressure chemical vapor deposition.

Figure 1C:
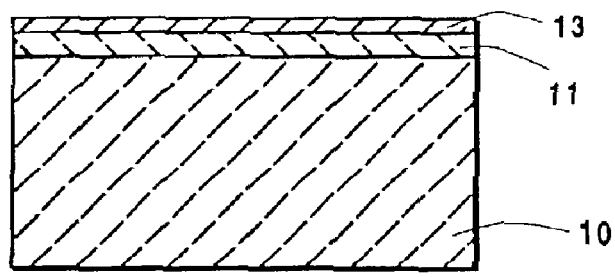

Referring to FIG. 1C, the structure of FIG. 1B is reacted with a metal containing reactant such as $WF_6$ to replace the silicon layer 12 with the metal to form a metal (tungsten) rich surface 13 on the surface of diffusion barrier 11. Such a reaction may be shown as:

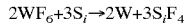

$$2WF_6 + 3S_i \rightarrow 2W + 3S_iF_4$$

As can be seen in FIG. 1C, the finished coated dielectric 10 contains a layer of diffusion barrier layer 11 having a metal (such as tungsten) rich surface. Such a structure will be used as shown hereinbelow to deposit a copper or other metal coating on the tungsten rich surface to provide the stud and/or line forming the interconnect.

Figure 2A:
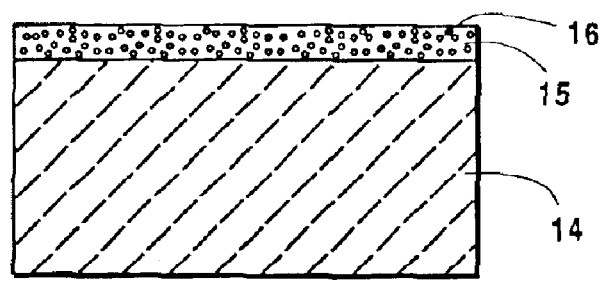
FIGS. 2A–2B show a sequence of steps for forming a metal rich surface on the surface of a dielectric according to another method of the invention.
Figure 2B:
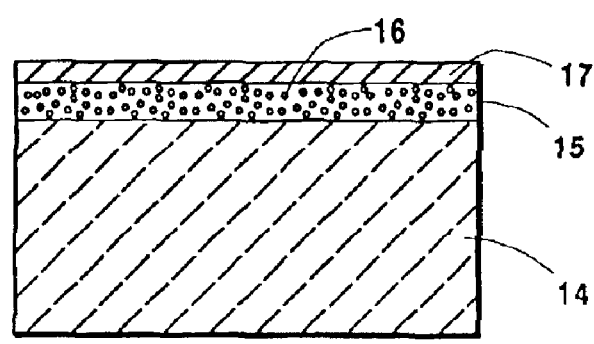

Another aspect in the invention is shown in FIGS. 2A–2B wherein, as in FIGS. 1A–1C, a sequence of steps is shown to form a metal rich surface on a dielectric having a diffusion barrier. Accordingly, in FIG. 2A, a dielectric 14 has a diffusion barrier 15 which is a refractory material containing silicon or other replaceable metal. A material such as titanium silicon nitride ($T_iS_iN$), tantalum silicon nitride ($T_aS_iN$), tungsten silicon nitride ($WS_iN$), and the like is deposited on the surface of the dielectric 14. The silicon atoms in the diffusion barrier layer 15 are shown as numeral 16.

The structure of FIG. 2A is reacted as above for FIGS. 1A–1C using a metal containing reactant such as $WF_6$ to replace silicon atoms 16 in the diffusion barrier 15 with the metal to form a metal rich surface 17, which for $WF_6$ is tungsten.

The final structure is shown in FIG. 2B and comprises a dielectric layer 14, a silicon containing diffusion barrier layer 15 on the surface thereof with a tungsten rich surface 17 on top of the diffusion barrier layer 15. This structure, as in FIGS. 1A–1C, will be used to deposit copper or other conductor on the surface thereof to form a stud or line interconnect in an electronic component.

The methods used to form the structures shown in FIGS. 1A–1C and 2A–2B offer many advantages. A uniform thin tungsten or other metal layer can be formed on the top of the diffusion barrier, typically less than 100Å. This metal layer is in effect a robust double structure diffusion barrier since tungsten is also another excellent diffusion barrier for the prevention of copper diffusion. Excellent step coverage of the tungsten layer can also be obtained since this method is a substitution of silicon and is not a conventional chemical vapor deposition from a gas phase. Additionally, tungsten has a lower resistivity than most of the barrier metals such as $T_a$, $T_aN$, Ti, TiN, WN, SiN, and the like and thus a lower via contact resistance can be obtained using the barrier layer formed by the method of the subject invention.

Figure 3A:
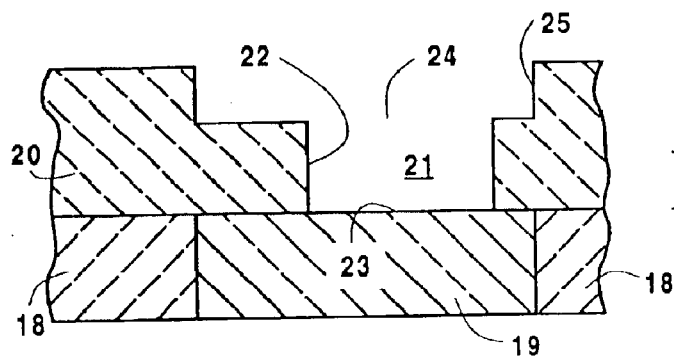
FIGS. 3A–3G show a sequence of steps for forming a dual Damascene line and interconnection stud structure according to a method of the invention.

Referring now to FIGS. 3A–3G, a sequence of steps is shown to form a line and stud interconnection using a dual Damascene process. In FIG. 3A a lower dielectric layer 18 is shown having a metal conductor 19 therein. An upper dielectric layer 20 is on the lower dielectric layer 18 and has an opening or via 21 through to the metal conductor 19 and an opening or trench 24. The via has side walls 22 and a base 23 and the trench 24 has trench side walls 25. This is a typical dual Damascene structure formed in a multilayer electronic component such as a VLSI and ULSI integrated circuit device.

Figure 3B:
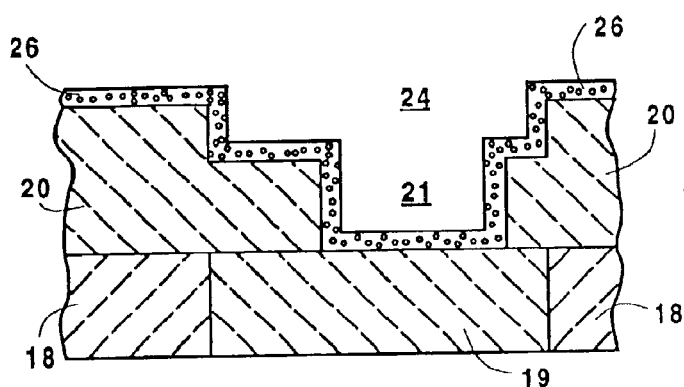

Referring to FIG. 3B, the structure of 3A is coated with a diffusion barrier layer 26 which covers the upper dielectric layer 20 including the via side walls 22 and base 23 and trench side walls 25.

Figure 3C:
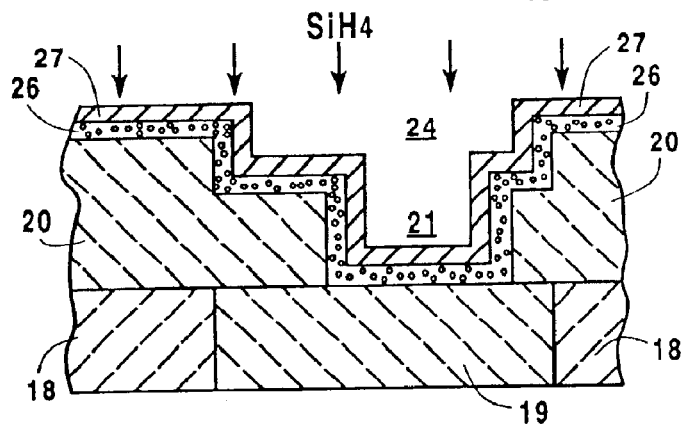
Figure 3D:
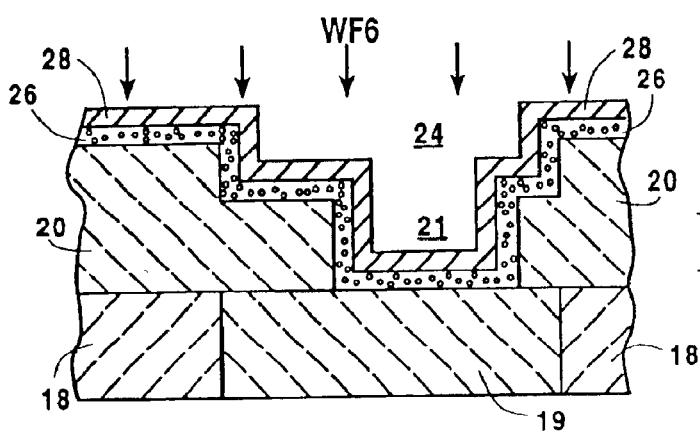

In FIG. 3C a reactant such as $SiH_4$ is used to form a silicon rich surface 27 on the surface of diffusion barrier 26. In FIG. 3D a reactant such as $WF_6$ is shown to react with the silicon rich surface 27 to form a tungsten rich surface 28.

Figure 3E:
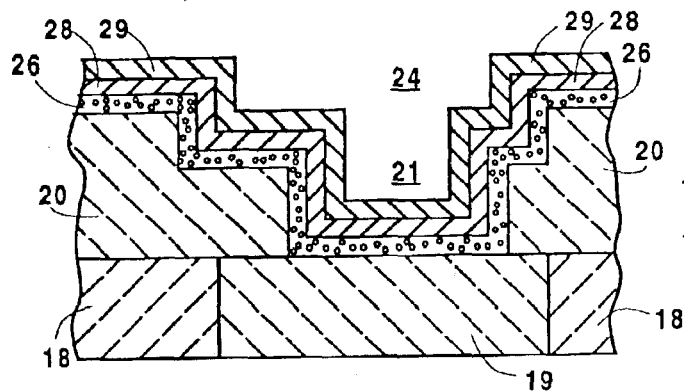

The tungsten rich surface 28 of the structure is now ready as shown in FIG. 3E for deposition of a copper or other metal seed layer 29 which may be applied using known techniques such as PVD, CVD, electroless deposition and electrolytic deposition. The purpose of the copper seed layer is to promote deposition of copper to fill the via and trench.

Figure 3F:
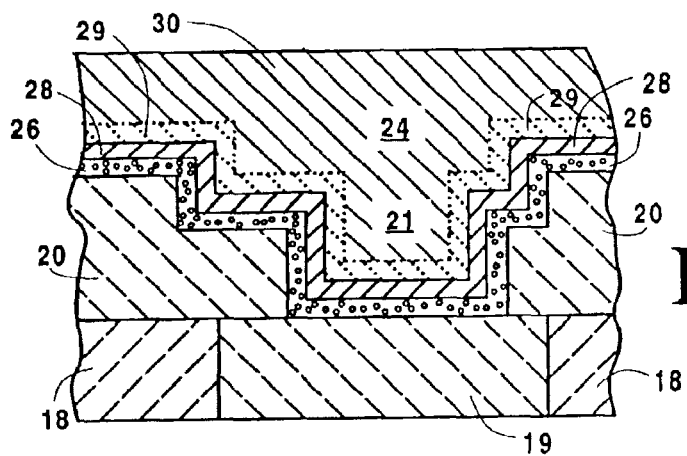

FIG. 3F shows electroplated copper 30 over the structure covering the copper seed layer 29 and filling the trench 24 and via 21. The copper seed 29 is shown using a dotted lines to indicate that the electroplated copper 30 and copper seed layer 29 form a single metal structure.

Figure 3G:
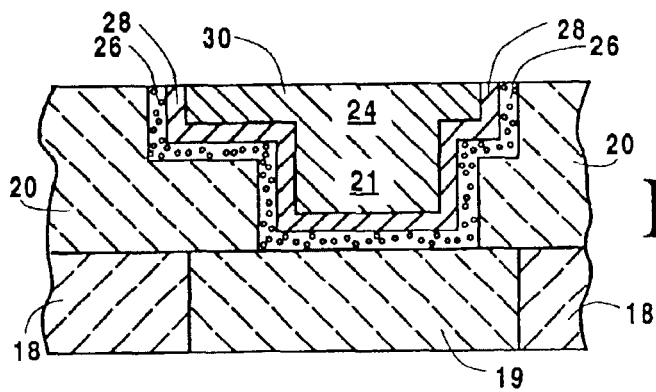

The structure of FIG. 3F is now typically planarized using chemical-mechanical polishing and the final interconnect structure made according to the invention is shown in FIG. 3G wherein the lower dielectric layer 18 having a metal conductor 19 therein is electrically connected to via 21 and trench 24 in upper dielectric layer 20. The via 21 and trench 24 comprise an outer layer of a diffusion barrier 26, an inner layer of a tungsten rich surface 28 and the electroplated copper layer 30 filling the via 21 and trench 24. Such a structure provides an interconnect with excellent step coverage, uniformity, low resistance and adhesion to CVD-copper and provides an electronic component having excellent electromigration resistance and other operating properties.

Figure 4:
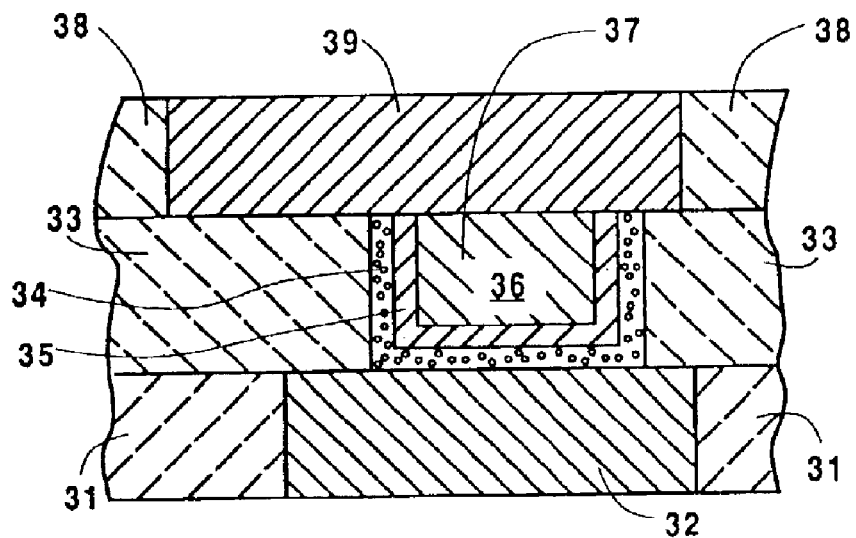
FIG. 4 shows an elevational view of an interconnect stud structure of the invention.
Figure 5:
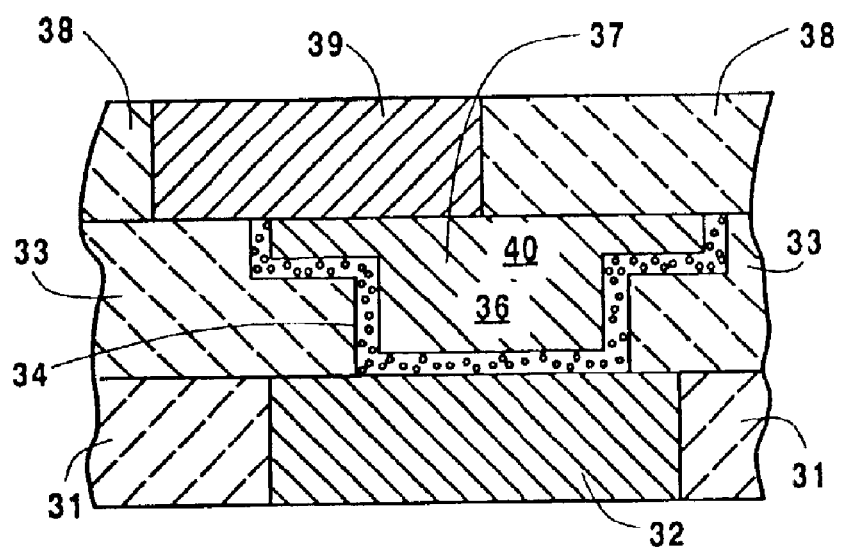
FIG. 5 shows an elevational view of an interconnect dual Damascene line and interconnection stud structure of the prior art.

FIG. 4 shows a multilayer interconnect structure of an electronic component of the invention comprising a lower dielectric layer 31 having a conductor 32 therein. Intermediate dielectric layer 33 has a via 36 comprising a diffusion barrier 34, a tungsten layer 35 and a copper conductor 37. The intermediate layer 33 is sandwiched between an upper dielectric layer 38 having a conductor 39 therein. As can be seen from FIG. 4, the via has a double structure diffusion barrier comprising a diffusion barrier material 34 and a tungsten layer 35 and provides excellent electrical properties and provides the interconnect between conductor 32 in dielectric 31 and conductor 39 in dielectric 38.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
1. A method for making multilayer electronic component integrated circuit devices wherein interconnects in the devices have excellent step coverage, uniformity, low resistance and adhesion to CVD-copper comprising the steps of:

forming a multilayer electronic component layer by layer with dielectric layers having openings therein with metallization formed in the openings to provide electrical connections between the layers;

forming a diffusion barrier layer in the openings in the dielectric layer which diffusion barrier layer is a refractory material containing replaceable silicon atoms;

forming a metal rich surface on top of the diffusion barrier layer by reacting the barrier layer with a metal containing reactant and replacing at least part of the replaceable atoms of the diffusion barrier layer with the metal of the metal containing reactant; and filling the openings in the dielectric layer with copper to provide a conductor which contacts the metallization in the dielectric layer to metallization in another layer.

2. The method of claim 1 wherein the refractory material is selected from the group consisting of titanium silicon nitride, tantalum silicon nitride and tungsten silicon nitride.

3. The method of claim 1 wherein the metal containing reactant is $WF_6$.

4. The method of claim 3 wherein the refractory material is selected from the group consisting of titanium silicon nitride, tantalum silicon nitride and tungsten silicon nitride.

* * * * *